(12) United States Patent
Allenberg (10) Patent No.: US 10,349,567 B2
(45) Date of Patent: Jul. 9, 2019

(54) EMI SHIELDING DEVICE

(71) Applicant: DET International Holding Limited, George Town (KY)

(72) Inventor: Sven Allenberg, Bahlingen (DE)

(73) Assignee: DELTA ELECTRONICS (THAILAND) PUBLIC CO., LTD., Samutprakarn (TH)

( * ) Notice: Subject to any disclaimer, the term of this patent is extended or adjusted under 35 U.S.C. 154(b) by 0 days.

(21) Appl. No.: 15/481,119

(22) Filed: Apr. 6, 2017

(65) Prior Publication Data

US 2017/0303447 A1    Oct. 19, 2017

(30) Foreign Application Priority Data

Apr. 14, 2016  (EP) ..................................... 16165378

(51) Int. Cl.
*H05K 9/00*    (2006.01)
*H05K 5/02*    (2006.01)

(52) U.S. Cl.
CPC ......... *H05K 9/0081* (2013.01); *H05K 5/0247* (2013.01); *H05K 9/0016* (2013.01)

(58) Field of Classification Search
CPC .... H05K 9/008; H05K 9/0016; H05K 9/0024; H05K 9/0026; H05K 9/0028; H05K 5/0247
See application file for complete search history.

(56) References Cited

U.S. PATENT DOCUMENTS

| 5,952,608 | A  | * | 9/1999  | Kim ..................... | H05K 9/0016 174/354 |
| 6,049,963 | A  | * | 4/2000  | Boe ......................... | G06F 1/184 24/563 |
| 6,320,120 | B1 | * | 11/2001 | Van Haaster ........ | H05K 9/0016 174/17 CT |
| 6,437,237 | B1 | * | 8/2002  | Kurrer ............. | H01R 13/65802 174/354 |
| 6,500,012 | B1 | * | 12/2002 | Billenstein .......... | H05K 9/0016 174/359 |
| 6,744,641 | B2 | * | 6/2004  | Schnabel ............. | H05K 9/0016 174/365 |

(Continued)

OTHER PUBLICATIONS

European Search Report for EP application No. 16165378.7, dated Oct. 17, 2016.

*Primary Examiner* — Hoa C Nguyen
*Assistant Examiner* — Keith DePew
(74) *Attorney, Agent, or Firm* — Vector IP Law Group LLC; Robert S. Babayi (57) ABSTRACT

The invention relates to an EMI gasket for mounting on a wall of a housing of an electrical appliance. The gasket includes a plurality of elements arranged in a row wherein two adjacent elements are interconnected by connection pieces. At least one of the elements includes a clamping section for clamping the device onto the housing and a shielding section to perform the shielding function. According to the invention, at least one element further includes a snapping member which serves as a barb for latching into a recess within the wall of the housing where the gasket is to be installed such that the gasket is locked on the wall thereby preventing unintentional movement of the gasket or even that the gasket is slipping off of the housing.

9 Claims, 3 Drawing Sheets

(56) References Cited

U.S. PATENT DOCUMENTS

| | | | | |
|---|---|---|---|---|
| 7,167,379 B2* | 1/2007 | DiBene, II | ................ | G06F 1/18 |
| | | | | 257/691 |
| 7,881,052 B2* | 2/2011 | Crippen | ............... | G11B 33/122 |
| | | | | 312/223.1 |
| 8,933,346 B1* | 1/2015 | Kramer | ................ | H05K 9/0016 |
| | | | | 174/354 |
| 2008/0047745 A1* | 2/2008 | Smeltz | ................ | H05K 9/0016 |
| | | | | 174/355 |

* cited by examiner

EMI SHIELDING DEVICE

TECHNICAL FIELD

The invention relates to an EMI (electromagnetic interference) shielding device for mounting on a base, including a plurality of elements arranged in a row wherein two adjacent elements are connected to each other and wherein at least one element includes a clamping section for clamping the device onto the base. The invention further relates to an electrical appliance with a casing including at least one wall. And the invention relates to a method for mounting an EMI shielding device on a base, including clamping the EMI shielding device on the base by slipping the device onto the base.

BACKGROUND ART

Every electrical or electronic device produces electrical fields and therefore emits radiation as a result of electrical activity. In most cases such a radiation is not desired since it may cause interferences and it may affect, i.e. disturb or even damage electrical devices. The radiation may either affect the device itself which emits the radiation or it may affect other devices in the vicinity of the emitting device. Additionally, also natural phenomena such as for example lightning of a thunderstorm may be a source of unwanted electromagnetic radiation which may affect an electrical or electronic device. In order to reduce or even eliminate the effect of such radiation electrical devices or often shielded. This is for example done by encasing a device with an electrically conductive material such as a metal connected to ground. With such a Faraday cage it is possible to prevent electromagnetic radiation that has been produced externally to enter the device or electromagnetic radiation that has been produced internally to leave the device. Often, such electrical devices have a casing which is made of a metal and is therefore not only used as the housing but at the same time also as the shielding of the device.

However, in many cases such devices need power that has to be supplied to the device or the device produces electrical power that has to be supplied to other devices. In another example, other electrical signals such as for example signals for data transmission or the like have to be delivered to or lead away from the device. Accordingly, the shielding has to have an opening through which such power or other signals can be fed, most often by means of corresponding cables. Through such a hole, electromagnetic radiation may however undesirably enter or leave the device.

In order to reduce the passage of electromagnetic radiation through such a hole, the hole may be provided with EMI shielding devices, so called EMI gaskets. An EMI gasket typically is made of an electrically conductive material and is mounted all around the edges of the opening to completely surround the opening. To do so, the gaskets are formed as a clamp or they do have a clamp part with which the gaskets are clamped onto an edge of a casing wall. Such EMI gaskets are usually marketed in the form of long strips that are built from a plurality of elements that are arranged in a row and where two neighboring elements are interconnected. Such gaskets, in particular when made of metal, are usually manufactured by cutting the interconnected elements from a flat, thin piece of metal and then applying the necessary bends, arcs, curves etc. to provide the desired shape. The cutting is done by punching, die-cutting or otherwise carving the required basic shape of the gasket.

For mounting the gaskets, the strips are cut into pieces to fit the edge where the gasket is to be mounted and then clamping the cut gasket onto the respective edge.

The shape of the gasket is chosen such as to minimize the passage of radiation. There is however not a particular shape of gasket that works well in different applications. Rather the shape of a gasket has to be adapted to and optimized in view of a particular application.

Such an EMI gasket may for example be made of a metal but EMI gaskets made of electrically conductive foam or another conductive material are also known. There are also different methods to attach the gasket to the casing. Whereas metallic gaskets are usually clamped onto the casing wall, foam gaskets are generally glued to the casing. Although foam gaskets usually do not perform as good as metal gaskets, metal gaskets may not be used in certain applications such as for example where loss prevention gaskets have to be used. Although foam gaskets are cheaper than metal gaskets, glued foam gaskets are weaker than metal gaskets and foam gaskets can easily be damaged and replacement is difficult because they are glued. Foam gaskets are aging and they do not resist high temperatures.

Accordingly, metal gaskets are generally preferred. But one major disadvantage of existing metal gaskets is that the gaskets mounted on a housing or a casing may get out of place or even slip off the base unintentionally because the clamping is not very strong. Moreover, the clamping must not be too strong because it should also be possible to voluntarily remove the gaskets if required.

But even if it would be acceptable to have a much stronger clamping of the gaskets, the gaskets would have to be made of a much stronger or thicker material which is not very useful in most applications.

SUMMARY OF THE INVENTION

It is the object of the invention to create an EMI shielding device pertaining to the technical field initially mentioned, that stays in place once mounted on a base such as a casing or a housing of an electrical appliance. Further objects of the invention are to create an electrical appliance including such an EMI shielding device as well as to create a method for mounting such an EMI shielding device on a base.

The solution of the invention is specified by the features of claim 1. As already mentioned above, EMI shielding devices according to the invention are often called EMI gaskets. In the following, the terms EMI gasket or simply gasket are therefore also used instead of the term EMI shielding device. Such EMI gaskets include a plurality of elements arranged in a row wherein two adjacent elements are interconnected. For mounting such an EMI gasket on a base, at least one of the elements includes a clamping section. According to the invention, said at least one element includes a snapping member for latching into a recess of the base and for locking the EMI gasket on the base.

The term base thereby refers to any appliance, device, apparatus, tool or other unit where such an EMI gasket is to be mounted. The base usually is some kind of appliance that consumes or produces electrical energy wherefore electrical energy has to be fed to the base or lead away from the base. The recess on the base may be a notch, a blind hole or a deformation of a wall of the base to form a dent or indentation but without a perforation of the wall, or the recess may include a perforation of the wall to form a hole, a slit, a slot or the like wherein the snapping member can engage.

In this way, the snapping member acts as some kind of barb that snaps into the recess on the base when the gasket is mounted on the base. Once the snapping member has latched into the recess, an undesired movement of the EMI gasket is prevented. Depending on the shape and size of the recesses, an undesired movement of the EMI shielding device in only one or more directions can be prevented. If for example the recess is formed and arranged such that only the snapping member of a single element of the gasket fits into the recess, the gasket is locked once the snapping member has latched into the recess. It may not move in any direction. If however the recess is longer and/or wider, the gasket may be slightly moved, in particular when not all of the gasket elements include a snapping member to engage into the recess. However, also in this case, the snapping member engaged within the recess prevents that the gasket is unintentionally pulled or wiped off the base.

In a further preferred embodiment of the invention, several or even all elements of the EMI gasket include a snapping member such that they may engage into a recess where available when mounted on the base. Further, all elements of the gasket preferably also include a clamping section to clamp the gasket onto the base.

The base preferably includes a plurality of recesses such that the snapping members of different elements may latch into different recesses.

In order to effectively shield electromagnetic interferences, the EMI gasket preferably includes or is even made of an electrically conducting material such as a metal or a conductive foam. There however also exist non-metal conductive materials and which may therefore generally be used to form such EMI gaskets. However, metals belong to the best conductors and are generally easy to process wherefore an EMI gasket according to the invention preferably includes or is made of a metal.

Since usually not every snapping member of a gasket latches into a recess of the housing, the non-locking snapping members are in direct contact with the housing thereby ensuring a good electrical contact between the housing and the gasket. Furthermore, since at least some of the snapping members of a gasket latch into a recess, the gaskets are also captive and therefore easily to assemble.

In a further preferred embodiment of the invention, each element of the EMI gasket has a strip-like shape including two or more bends. The elements are arranged in a row such that they are parallel to each other. The bends then form the different parts and sections of the elements such as for example the snapping member and other parts and sections as described below.

The single elements and therewith the whole EMI gasket is formed from a thin piece of material such as for example a sheet metal. The sheet is cut into strips and then the elements are formed by cutting out the space between two elements, thereby leaving at least one connection to interconnect two neighboring elements.

In another preferred embodiment, at least one of the elements includes a shielding section to perform the shielding function of the gasket. Most preferably, all of the elements include such a shielding section. However, a gasket may also be structured to comprise one or more elements that include a snapping member for holding and locking the gasket on the base and it one or more further elements that include a shielding section.

Although one part of a gasket element is designated as a snapping member and another part of the respective gasket element is designated as a shielding section, it is to note that also the snapping member of a gasket element may contribute to the shielding performance of the gasket.

The clamping section of a gasket element preferably includes a bend. The segment of the element on a first side of this bend is called a first clamping segment and the segment of the element on the other side of the bend is called a second clamping segment. The two clamping segments serve to clamp the particular element and accordingly the whole gasket onto the base by clamping the base or a part of it between the two clamping segments.

It would however also be possible to mount the gasket on the base by other means such as by rivets, screws, glue or the like. But since it shall be easily possible to release the connection between the base and the gasket and to remove the gasket without damage, the clamping method is preferably used to mount the gasket on the base.

The snapping member of an element may generally be formed by any part or section of the element. This may either be an end section of the element or an intermediate section of the element.

But the snapping member is preferably formed by a section of the first clamping segment that protrudes or extends towards the second clamping segment.

It is even more preferred that the section of the first clamping segment that forms the snapping member is an end section of the first clamping segment. The term end section thereby is to be understood to refer to an end of the clamping segment which also is an end of the respective gasket element. Accordingly, the snapping member is formed by an end section of a gasket element.

The shielding section of a gasket element that includes such a shielding section is preferably arranged at an end section of the second clamping segment. Again, this means that the shielding section is formed by and end section of a gasket element.

In case of a gasket element that includes a snapping member as well as a shielding section, the snapping member is formed by one end section of the element whereas the shielding section is formed by the other end section of the element.

The shielding section may have any possible shape and is usually adapted to the needs of a particular application. It may include one or more bends with intermediate sections of different lengths. The bends may be narrow or wide and they may point in the same or different directions.

It is however preferred that the shielding section includes an arcuate section facing away from the snapping member and pointing back to the bend of the clamping section. This general structure of the shielding section has shown to be a good basic shape which then can be adapted to the needs of the particular application.

In order to provide gasket strips that may be cut to every desired length, it is preferred that all elements of an EMI gasket include a snapping member, a clamping section and a shielding section as well. And it is even more preferred that—apart from the interconnections between two adjacent gasket elements—all elements of the gasket are identical in shape and size. In this way, the strips can be cut into any desired length where two gaskets of the same length are identical. Further, such gaskets can be manufactured in a simple, fast and cost-effective way.

As outlined above EMI shielding device according to any of claims 1 to 9, wherein the device is made of a metal. The most preferred metal is beryllium copper. Beryllium copper is often used for such EMI gaskets because of its relatively high electrical conductivity, for example compared to steel, and its advantageous processing properties.

Apart from beryllium and copper, the alloy may also include other compounds such as for example cobalt, nickel or silicon.

Generally, such an EMI gasket can be clamped on a base in different ways. The clamping section may for example have a wide span length such as to encompass two different edges or even two different sides of the base.

It is however preferred that the clamping section has just a small span length such that it may be mounted on an edge of a wall of the base. In this context the term on an edge is to be understood as a single edge. Particularly, for mounting the gasket on the base, the gasket is slipped over the edge of a wall such that the gasket is clamped on the edge of the wall.

In those cases where the clamping section includes two clamping segments as described above, the gasket is mounted on an edge of the wall such that the respective area of the wall near its edge comes to rest between the two clamping segments.

As described above, such EMI gaskets are used to seal an opening with the housing or casing of an electrical appliance as good as possible. Accordingly, an EMI gasket according to the invention is preferably adapted for mounting it on an edge of a hole or opening in the wall of a casing or housing of an electrical appliance.

The solution of the invention regarding the electrical appliance is described in the following. An electrical appliance according to the invention includes at least one wall, usually a wall that forms a side wall or a side panel of the housing or casing of the electrical appliance, where an EMI shielding device according to the invention is mounted on an edge of that wall.

The edge of the wall may be an outer edge of the wall. But in many cases the housing or casing of an electrical appliance includes a separate hole or opening through which cables with electric current guiding conductors are fed. Accordingly, it is preferred that the edge is not an outer edge of the wall but an edge that is formed by a hole or opening in the wall for feeding a cable through the casing.

An EMI shielding device according to the invention may be used in every application where a conventional EMI gasket of the same type can be used. The term same type in this connection means an EMI gasket that also includes a clamping section for clamping the gasket onto an edge of a wall of the base. In particular, an EMI shielding device according to the invention may also be used with casings or housings of electrical appliances that do not include any recesses where the snapping members of the EMI shielding device may latch into.

But in a further preferred embodiment of an electrical appliance according to the invention, said wall includes at least one recess. The recess is arranged within the wall such that the snapping member of an element of the EMI shielding device may latch or is latched into the recess.

The solution of the invention regarding the method for mounting an EMI shielding device according to the invention on a base is described in the following.

The method includes clamping the EMI shielding device on the base and then locking the EMI shielding device on the base. The step of clamping the EMI shielding device on the base preferably is performed by slipping the device onto a wall of the base and the step of locking the EMI shielding device on the base is preferably performed by latching the snapping member of an element of the EMI shielding device into a recess of the base.

It is to note that not all elements of the gasket have to include a snapping member. Accordingly, the step of locking the EMI shielding device on the base is preferably performed by latching the snapping member of at least one of the elements of the EMI shielding device that has such a snapping member into a recess of the base.

Other advantageous embodiments and combinations of features come out from the detailed description below and the totality of the claims.

BRIEF DESCRIPTION OF THE DRAWINGS

The drawings used to explain the embodiments show.

In the figures, the same components are given the same reference symbols.

PREFERRED EMBODIMENTS

Figure 1:
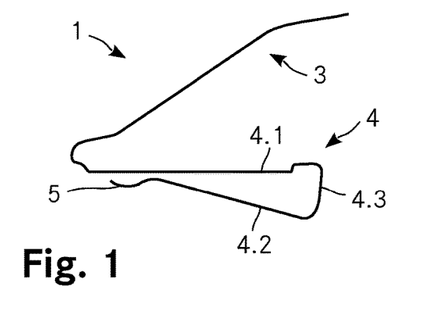
FIG. 1 depicts an EMI gasket according to the prior art in a non-mounted state in a side view.
Figure 2:
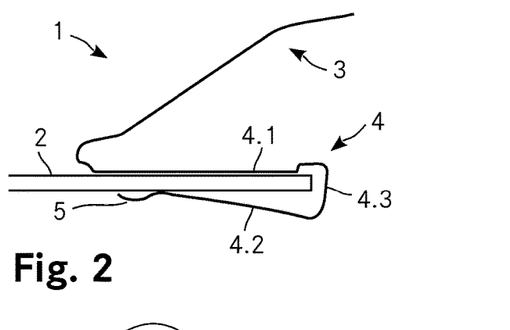
FIG. 2 shows the EMI gasket shown in FIG. 1 mounted on the edge of a wall.

FIG. 1 shows an EMI gasket 1 according to the prior art. The gasket 1 is shown and it is shown in a state where it is not mounted on a base, a wall or the like. The gasket 1 is shown in a side view in a direction parallel to the longitudinal extension of the gasket 1. FIG. 2 shows the same gasket 1 mounted on the edge of a wall 2 such as for example the wall 2 of a housing of an electrically driven device. Also in FIG. 2 the gasket 1 is shown in the same side view as in FIG. 1.

The gasket 1 includes a shielding part 3 and a clamping part 4. The clamping part 4 comprises a first clamping leg 4.1 and a second clamping leg 4.2 connected by a kink or bend 4.3. The shielding part 3 is connected to the end of the first clamping leg 4.1 opposite the bend 4.3 and includes several further bends and curves in order to best fulfill the required shielding function together with the shielding function of the clamping part 4.

The gasket 1 is mounted on the wall 2 by slipping it over the edge of the wall 2 such that the wall 2 becomes positioned between the two clamping legs 4.1, 4.2 as shown in FIG. 2. As can be seen by comparing FIGS. 1 and 2, the clamping part 4 is slightly deformed when the gasket 1 is slipped over the edge of the wall 2 such that the clamping legs 4.1, 4.2 are slightly pushed apart to provide enough room for the wall 2. Accordingly, the clamping part 4 is slightly stressed such that the wall 2 is clamped by the clamping legs 4.1, 4.2 and the gasket is mounted on the wall 2.

However, as can be seen from FIG. 2, the gasket is not locked in place and can be moved in each direction. It may even slide off the wall 2 unintentionally if someone or something snags on it. And although the second clamping leg 4.2 includes and a bended end section 5 which seems to be rather similar to the barb of a gasket according to the invention, it can be seen that this end section 5 may not latch into a recess or opening within the wall 2, if such a recess or opening would be present at all. Rather, the end section 5 is pressed away from the wall 2 when the gasket 1 is slipped over the edge of the wall 2.

Figures 3, 4, 5:
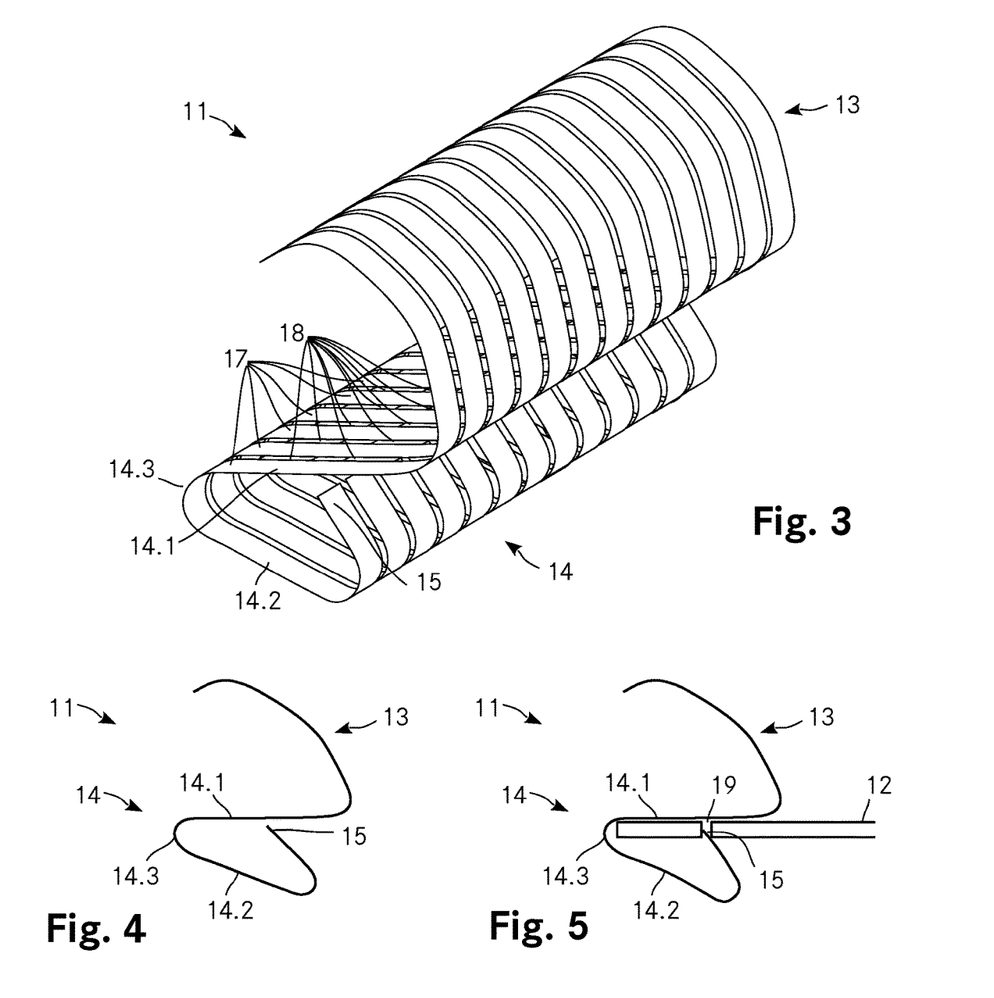
FIG. 3 depicts an EMI gasket according to the invention in a perspective view.
FIG. 4 shows the EMI gasket shown in FIG. 2 in a side view in a non-mounted state.
FIG. 5 shows the EMI gasket shown in FIG. 2 in a side view mounted on the edge of a wall.

FIG. 3 shows a first embodiment of an EMI gasket 11 according to the invention. In FIG. 4 the gasket 11 is shown in a side view and in FIG. 5 it is shown in the same side view mounted on the edge of a wall 12 that includes a recess 19. In FIG. 5 actually a cross section of the wall 12 is shown in order to more clearly show the principles of the invention.

The gasket 11 again includes a shielding part 13 and a clamping part 14 with two clamping legs 14.1, 14.2 interconnected by a bend 14.3. As can be seen, the gasket 11 is formed by a series of single elements 17 arranged in a row where two neighboring elements 17 are interconnected by connection pieces 18. In this case, two neighboring elements 17 are interconnected by two connection pieces 18. In FIG. 3, for reasons of convenience the gasket is shown to include only 13 elements whereas usually such a gasket includes clearly more elements.

In order to form the shielding part 13 of an element, the end section of an element that is connected to the first clamping leg 14.1 in this embodiment generally includes a large arc or bow which first leads away from the clamping part 14 but points back to back to the bend 14.3 of the clamping part 14.

At the end of the second clamping leg 14.2, each element of the gasket 11 includes a snapping member in the form of a barb 15. When slipping the gasket 11 onto the edge of the wall 12 for mounting it on the wall 12, the barb 15 is slightly pushed down, which in this case means away from the first clamping leg 14.1, such that the clamp formed by the clamping part 14 is slightly loaded thereby clamping the gasket 11 onto the wall 12. When the gasket 11 is further slipped onto the edge of the wall 12, the barb 15 latches into the recess 19 and thereby locks the gasket 11 on the wall 12.

In this way, the barb of the gasket 11 very much reduces the risk that that gasket is unintentionally moved out of place or even slipped off of the wall 12. It is however still possible to remove the gasket 11 without spending a great effort or without the risk of damaging the gasket 11 or the wall 12.

As also can be seen in FIG. 5, the clamping of the gasket 11 on the wall 12 is achieved by the first clamping leg 4.1 and the barb 15 itself.

Figures 6, 7:
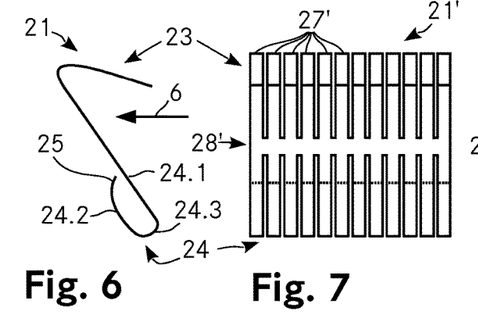
FIG. 6 shows another EMI gasket according to the invention in a side view.
FIG. 7 shows a front view of a first alternative embodiment of the EMI gasket shown in FIG. 6.

FIG. 6 shows a second embodiment of an EMI gasket 21 according to the invention in a side view. The gasket 21 is simpler than the gasket 11 of the first embodiment. It also includes a shielding part 23 and a clamping part 24 with two clamping legs 24.1, 24.2. In this case, the first clamping leg 24.1 more or less corresponds to a straight strip and the second clamping leg 24.2 is shorter than the first clamping leg 24.1. Further, the tip of the barb 25 points back to the first clamping leg 24.1 bit it does point away from the bend 24.3 whereas the tip of the barb 15 in the first embodiment points back to the bend 14.3. The shielding part 23 also just includes a straight piece of the element that is connected to the first clamping leg 24.1 via a further bend of the element.

Figure 8:
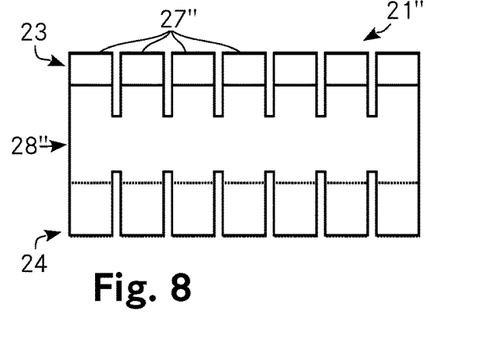
FIG. 8 shows a front view of a second alternative embodiment of the EMI gasket shown in FIG. 6.

FIGS. 7 and 8 show front views in the direction of the arrow 6 of different alternatives 21', 21" for the particular shape of the elements of the gasket 21. In FIG. 7, the single elements 27' of the alternative 21' are rather long and narrow whereas the elements 27" of the alternative 21" are much wider compared to their length. Accordingly, in order to provide about the same length of a gasket, the number of elements 27' needed in the gasket alternative 21' is much higher than the number of elements 27" needed in the alternative 21".

Another aspect shown in FIGS. 7 and 8 is that the connection pieces 28' can be short such as shown in the alternative 21' or the connection pieces 28" can be made wider and longer as shown in the alternative 21".

Figure 9:
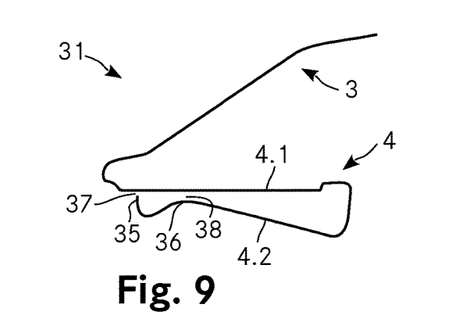
FIG. 9 shows another EMI gasket according to the invention in a side view in a non-mounted state.
Figure 10:
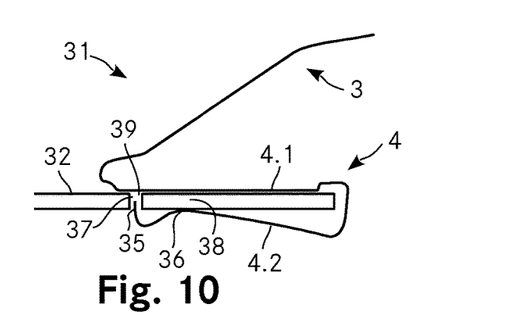
FIG. 10 shows the EMI gasket shown in FIG. 9 in a side view mounted on the edge of a wall.

FIGS. 9 and 10 show a third embodiment of an EMI gasket 31 according to the invention. The gasket 31 is largely identical to the prior art gasket 1 shown in FIG. 1.

The only difference is the end section of the second clamping leg 4.2 which is formed by a barb 35 instead of the simple end section 5 shown in FIG. 1. Unlike said end section 5, the barb 35 in this third embodiment can and does latch into a recess 39 of a wall 32 when mounted on that wall 32 as shown in FIG. 10. This is possible because the end section of the clamping leg 4.2 is bent towards the first clamping leg 4.1 and it is a bit longer such that it may still latch into the recess 39 although the wall 32 is clamped between the clamping legs 4.1, 4.2. In fact, what enables the latching of the barb 35 into a recess 39 of a wall 32 when mounted thereon, is the length of the tip of the barb 35. As can be seen in FIG. 9, in the non-mounted state, the distance 37 between the clamping leg 4.1 and the tip of the barb 35 is smaller than the distance 38 between the clamping leg 4.1 and that part 36 of the second clamping leg 42 closest to the clamping leg 4.1. And as shown in FIG. 10, the distance 37 is smaller than the distance 38 also when the gasket 31 is clamped onto the wall 32 and the barb 35 locked into the recess 39.

As also can be seen in FIG. 10, the clamping of the gasket 31 on the wall is not achieved by the first clamping leg 4.1 and the barb 35 but between the first clamping leg 4.1 and the part 36 of the second clamping leg 4.2 closest to the clamping leg 4.1.

In FIG. 11-15 side views of different examples of EMI gaskets according to the invention are shown.

Figure 11:
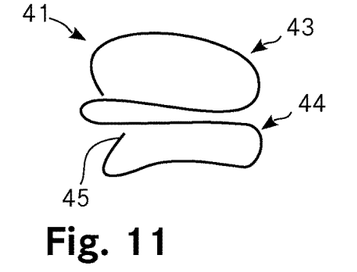
FIG. 11-15 represents different examples of EMI gaskets according to the invention in a side view.

FIG. 11 shows a gasket 41 with a clamping part 44 where the barb 45 is connected to one end of the clamping part 44 and the shielding part 43 is connected to the other end of the clamping part 44.

Another aspect of the gasket 41 is the shape of the shielding part 43 which is formed by an almost closed loop.

Figure 12:
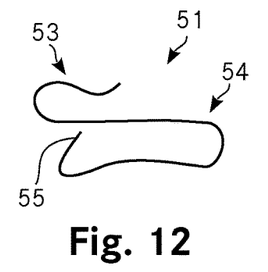

The clamping part 54 of the gasket 51 shown in FIG. 12 and the barb 55 are identical to the clamping part 44 and the barb 45 of the gasket 41. But the shielding part is much smaller.

Figure 13:
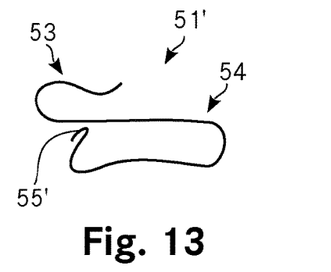

The gasket 51' shown in FIG. 13 is identical to the gasket 51 except for the barb 55' which in this case has a tip that includes a further bent such that the barb 55' is not formed by the end of an element but by a sharp bend.

Figure 14:
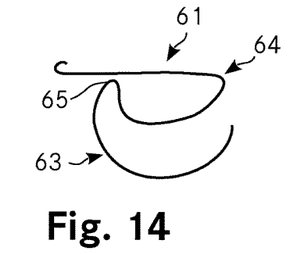

The main difference of the gasket 61 compared to the other embodiments is the fact, that the shielding part 63 is not connected to the side of the clamping part 64 opposite to the barb 65 but that the shielding part 63 is connected to the barb 65.

Figure 15:
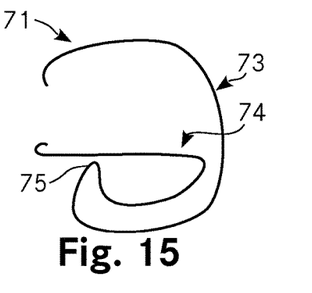

The gasket 71 shown in FIG. 15 largely corresponds to the gasket 61. However, the shielding part 73 is much larger and is even bent around the whole clamping part 74.

Figure 16:
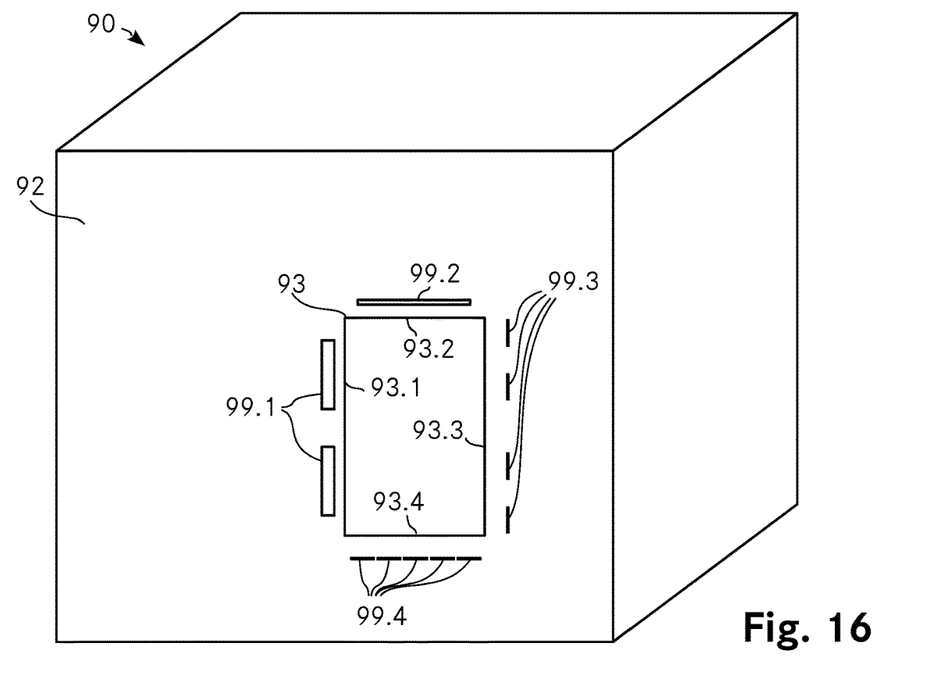
FIG. 16 is an electrical appliance including an opening and recesses for mounting an EMI gasket according to the invention.

FIG. 16 shows an electrical appliance 90 including a front wall 92. The front wall 92 includes an opening 93 for feeding cables into and/or out of the appliance 90. The wall 92 further includes a plurality of recesses 99.1, 99.2, 99.3, 99.4 of different shapes and sizes.

Figure 17:
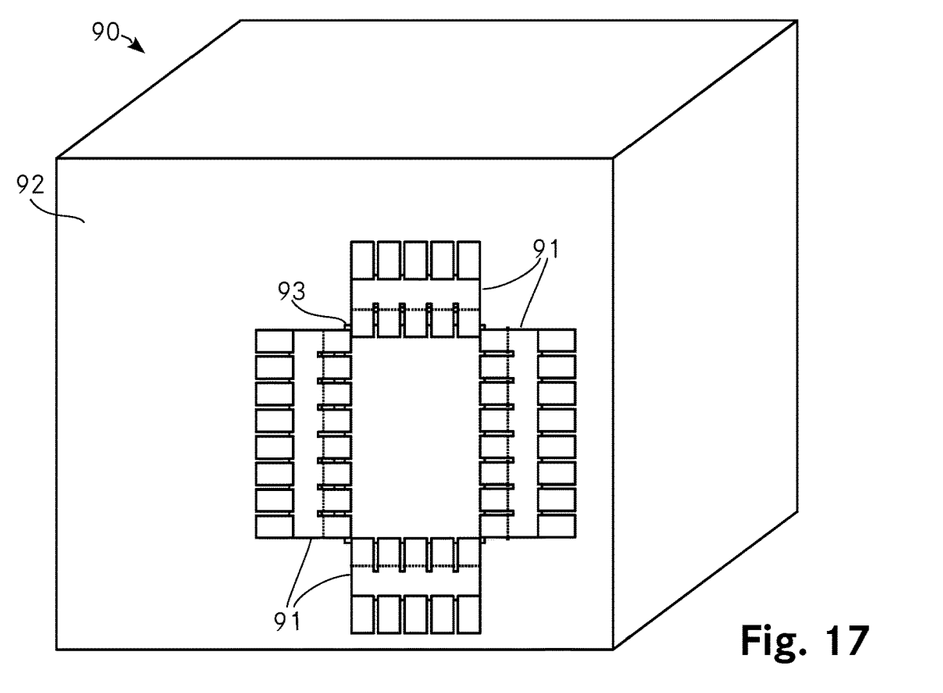
FIG. 17 shows the electrical appliance shown in FIG. 16 with EMI gaskets mounted around the opening and latched into the recesses.

FIG. 17 shows the electrical appliance 90 of FIG. 16 but with EMI gaskets 91 mounted on the edges 93.1, 93.2, 93.3, 93.4 of the opening 93 within the front wall 92. The gaskets 91 are for example gaskets as the one shown in FIG. 6. Apart from their length the gaskets 91 are identical. However, to show the flexibility of the invention, the recesses 99.1, 99.2, 99.3, 99.4 are different for each edge 93.1, 93.2, 93.3, 93.4.

The wall 92 includes two long and wide recesses 99.1 near the first edge 93.1. When mounting a gasket 91 on the edge 93.1, the distance of the recesses 99.1 from the edge 93.1 is chosen such that the barbs of the gasket can latch into the recesses 99.1 before the gasket is fully slipped onto the edge 93.1. So the gasket can be moved in a direction perpendicular to the edge 93.1 while its barb is latched into the recesses 99.1. Further, as the recesses 99.1 do not extend along the whole edge 93.1, not all barbs of the elements of the gasket 91 can latch into one of the recesses 99.1 but at least some of them do latch into one of the recesses 99.1 thereby locking the gasket 91 on the edge 93.1. It may however be that the gasket may slightly move in a direction parallel to the edge 93.1. But those barbs that are latched into one of the recesses 99.1 prevent that the gasket can be moved too much and they particularly prevent that the gasket may slip off the edge 93.1.

The wall 92 includes one single, but narrow and long recess 99.2 near the second edge 93.2. When mounting a gasket 91 on the edge 93.2, the distance of the recess 99.2 from the edge 93.2 is chosen such that the barbs of the gasket 91 latch into the recess 99.2 before the gasket is fully slipped onto the edge 93.2. But since the recess 99.2 is rather narrow, the gasket may not be moved in a direction perpendicular to the edge 93.2 once the gasket is locked. And again, only the barbs of the inner elements of the gasket 91 can latch into the recess 99.2 but the barbs of the outer elements may not latch into the recess 9.2. However, the length of the recess 99.2 is adapted to the width of the elements such that the barbs of all middle elements just latch into the recess 99.2 and such that no movement of the gasket 91 in a direction parallel to the edge 93.2 is possible.

The wall 92 further includes four narrow and short recesses 99.3 near the third edge 93.3. When mounting a gasket 91 on the edge 93.3, the distance of the recesses 99.3 from the edge 93.3 is chosen such that the barbs of the gasket latch into the recesses 99.3 only when the gasket is fully or almost fully slipped onto the edge 93.3. So the gasket cannot be moved anymore in a direction perpendicular to the edge 93.3. Further, as the recesses 99.3 do not extend along the whole edge 93.3, not all barbs of the elements of the gasket 91 can latch into one of the recesses 99.3. In this case, the recesses 99.3 are adapted and arranged such that the barbs of just the first, the third, the sixth and the eighth element of the gasket 91 latch into the recesses 99.3. Since the length of the recesses 99.3 corresponds to the widths of the barbs, the gasket is locked and cannot move.

The wall 92 further includes a number of narrow and short recesses 99.4 near the third edge 93.4 that corresponds to the number of elements with barbs of the gasket 91 to be mounted. When mounting a gasket 91 on the edge 93.4, the distance of the recesses 99.4 from the edge 93.4 is chosen such that the barbs of the gasket exactly latch into the recesses 99.4 only when the gasket is fully or almost fully slipped onto the edge 93.4. So the gasket cannot be moved anymore in a direction perpendicular to the edge 93.4. Further, the barbs of all elements of the gasket 91 can latch into one of the recesses 99.4. And also in this case, the recesses 99.4 are adapted and arranged such that the barbs of just fit into the recesses 99.4 to lock the gasket on the edge 93.4.

In summary, it is to be noted that the invention enables to create gaskets that may not be accidentally or unintentionally be moved out of place or even slipped off of the device on which they are mounted. Be adapting the number and shape of the elements of a gasket including barbs and/or by adapting the recesses on the device on which the gaskets shall be installed, some movement may be allowed or even helpful but the invention prevents that a gasket accidentally or unintentionally is moved out of place or even slipped off of the device. The invention enables the creation of self-retaining EMI gaskets. Nevertheless, a gasket according to the invention can also be easily removed in necessary for example to enable repair or service work or just for replacing a gasket.

The invention claimed is:

1. An EMI shielding device for mounting on a base, including a plurality of elements that are all identical in shape and size and are arranged in a row, parallel to each other and perpendicular to a longitudinal axis of the EMI shielding device, each element comprising a striplike shape terminated at only two ends, with a first end comprising a first tip of the element, and a second end comprising a second tip of the element, wherein two adjacent elements are interconnected, at least one element including a clamping section with a bend, a first clamping segment on one side of the bend and a second clamping segment on another side of the bend for clamping the device onto the base between the two clamping segments, wherein said at least one element includes a snapping member formed by a section of the first clamping segment protruding towards the second clamping segment for latching into a recess of the base and for locking the EMI shielding device on the base at the first tip and wherein at least one element includes a shielding section arranged at an end section of the second clamping segment, wherein the shielding section includes an arcuate section facing away from the snapping member and pointing back to the bend of the clamping section at the second tip.

2. The EMI shielding device according to claim 1, wherein each element has a strip-like shape including two or more bends.

3. The EMI shielding device according to claim 1, wherein the section of the first clamping segment that forms the snapping member is an end section of the first clamping segment.

4. The EMI shielding device according to claim 1, wherein the device is made of a metal of beryllium copper.

5. The EMI shielding device according to claim 1 for mounting on an edge of a wall, particularly on the edge of a hole in the wall of a casing of an electrical appliance.

6. An electrical appliance with a casing including at least one wall, wherein an EMI shielding device according to claim 1 is mounted on an edge of the wall of the casing.

7. The electrical appliance according to claim 6, wherein the edge is formed by a hole in the wall for feeding a cable through the casing.

8. The electrical appliance according to claim 6, wherein the wall includes a recess and wherein the snapping member of said at least one element of the EMI shielding device is latched into the recess.

9. A method for mounting an EMI shielding device according to claim 1 on a base, including clamping the EMI shielding device on the base with a clamping section by slipping the device onto a wall of the base and, locking the EMI shielding device on the base, wherein clamping the device onto the base includes clamping each of the elements that are identical in shape and size on the base by clamping the base between the first clamping segment of the clamping section and the second clamping segment of the clamping section and wherein locking the EMI shielding device on the base includes locking each of the elements on the base by latching the snapping member of each element of the EMI shielding device into a recess of the base.

* * * * *